United States Patent
Simpson et al.

(10) Patent No.: US 11,130,358 B2
(45) Date of Patent: Sep. 28, 2021

(54) AUDIO DATA COMPRESSION

(71) Applicant: Hewlett-Packard Development Company, L.P., Spring, TX (US)

(72) Inventors: Shell S Simpson, Boise, ID (US); Cooper G Urie, Boise, ID (US); Dee Chou, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 99 days.

(21) Appl. No.: 16/346,810

(22) PCT Filed: Nov. 29, 2016

(86) PCT No.: PCT/US2016/063953
§ 371 (c)(1),
(2) Date: May 1, 2019

(87) PCT Pub. No.: WO2018/101906
PCT Pub. Date: Jun. 7, 2018

(65) Prior Publication Data
US 2020/0062015 A1 Feb. 27, 2020

(51) Int. Cl.
*B41J 29/26* (2006.01)
*G10L 19/16* (2013.01)
*G10L 25/51* (2013.01)

(52) U.S. Cl.
CPC .............. *B41J 29/26* (2013.01); *G10L 19/16* (2013.01); *G10L 25/51* (2013.01)

(58) Field of Classification Search
CPC ........ B41J 29/38; B41J 29/393; B41J 11/006; B41J 29/26; B41J 29/46; G06F 11/0733; G06F 11/0748; G06F 11/079; G06F 11/3041; G06F 11/3058; G11B 27/031; G11B 27/36; G11B 19/048; G11B 20/1816; G11B 20/182; G11B 27/3027; G01M 13/028; G01N 29/14; G03G 15/0848; G03G 15/5079; G03G 15/55; G03G 15/553; G03G 15/6511; G03G 15/70; G03G 15/703; G03G 2215/00341; G03G 2015/00548; G03G 2215/00569; G03G 2215/00637; G06K 15/02; G06K 15/027; G07D 11/235;
(Continued)

(56) References Cited

U.S. PATENT DOCUMENTS 5,564,001 A 10/1996 Lewis
5,945,602 A * 8/1999 Ross ..................... G01V 1/001
73/570

(Continued)

OTHER PUBLICATIONS

POS Buzzer with Sensor, 2015, 4 pages—http://www.beaglehardware.com/printbuzzersensor.html.

*Primary Examiner* — Duc Nguyen
*Assistant Examiner* — Alexander L Eljaiek
(74) *Attorney, Agent, or Firm* — HP Inc. Patent Department

(57) ABSTRACT

In one example of the disclosure, subject audio data, indicative of a subject audio captured via a transducer during an operation of a subject electromechanical device, is accessed. Baseline audio data, indicative of a baseline audio captured during an operation of a baseline electromechanical device, is accessed. An electronic file that includes differences between the subject audio data and the baseline audio data is created.

14 Claims, 7 Drawing Sheets

(58) Field of Classification Search
CPC ..... G07D 11/237; G07F 19/20; G08B 21/187; H03M 7/3059; H04L 69/04; H04N 1/00002; H04N 1/00029; H04N 1/00034; H04N 1/00037; H04N 1/0005; H04N 1/00058; H04N 1/00061; H04N 1/00068; H04N 1/00079; H04N 1/6033; H04R 29/00
USPC .................. 381/56, 58; 700/94; 347/14, 19; 375/E7.226; 382/112; 714/E11.026, 714/47.2, 742
See application file for complete search history.

(56) References Cited

U.S. PATENT DOCUMENTS

| | | |
|---|---|---|
| 8,655,466 B2 | 2/2014 | Moulios |
| 9,069,849 B1 | 6/2015 | Roblek et al. |
| 9,111,580 B2 | 8/2015 | Kirsch |
| 9,217,980 B2 | 12/2015 | Sakharshete et al. |
| 2002/0172373 A1* | 11/2002 | Boss ................ H04R 29/00 381/59 |
| 2004/0015251 A1 | 1/2004 | Hamada et al. |
| 2004/0112136 A1 | 6/2004 | James et al. |
| 2008/0190268 A1 | 8/2008 | McNally |
| 2008/0260276 A1 | 10/2008 | Yamatani et al. |
| 2009/0022536 A1 | 1/2009 | Takeshita et al. |
| 2014/0148933 A1 | 5/2014 | King et al. |

* cited by examiner

AUDIO DATA COMPRESSION

BACKGROUND

Accurate detection of errors in the functioning of printers and other electromechanical devices is important to ensure quality and throughput. Further, in many cases prompt detection of errors can reduce operating and maintenance costs associated with the device. One approach for detecting such operating errors is to analyze audio captured during the operation of the device.

DRAWINGS

DETAILED DESCRIPTION

Figure 1:
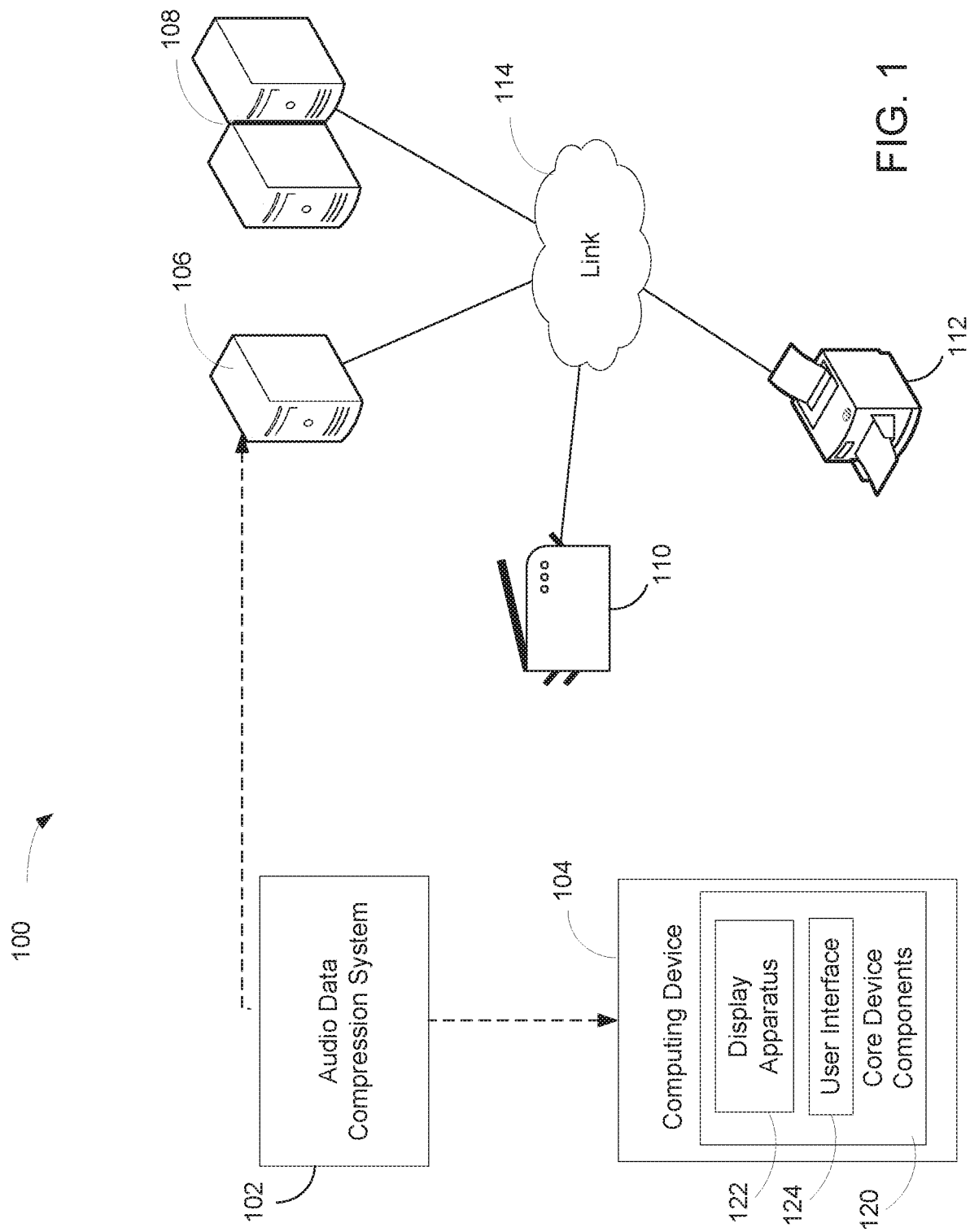
FIG. 1 is a block diagram depicting an example environment in which various examples of the disclosure may be implemented.

One approach for analyzing audio captured during operation of an electromechanical device to detect errors is to compare the captured audio to a baseline audio representative of a correctly operating device. However, comparing captured audio to a baseline can be challenging for multiple reasons. Audio data can be quite large, such that transmission and storage of audio data can make audio analysis expensive. Also, comparing captured audio to a baseline can be challenging where there are timing differences between two samples. For instance, in an example of a printer electromechanical device, to accurately spot differences between a captured subject audio and a baseline audio it is helpful to know that the subject audio and the baseline audio are representative of a same process point or process period in the operation of the printer.

To address these issues, various examples described in more detail below provide a system and a method for audio data compression. In one example of the disclosed system, subject audio data is accessed, wherein the subject audio data is indicative of a subject audio captured via a transducer during an operation of a subject electromechanical device. Baseline audio data is accessed, wherein the baseline audio data is indicative of a baseline audio captured during an operation of a baseline electromechanical device. An electronic file is created, the electronic file including differences between the subject audio data and the baseline audio data.

In certain examples of the disclosed system, positional sensor data may be accessed. The positional data is indicative of readings from a positional sensor at the subject electromechanical device. The system utilizes the positional sensor data to determine a subject position along a process route as the subject audio is captured. Baseline position data is accessed, wherein the baseline position data is representative of a baseline position along a process route as the baseline audio was recorded. The determined subject position and the baseline position are utilized to identify a subject segment of the captured audio and a baseline segment of the baseline audio that are representative of a same operation performed at the subject and baseline electromechanical devices. For instance, if the electromechanical device is a printer, the approach described in this disclosure could use the triggering of the paper path sensors in the printer by media as cues for aligning the subject audio data and the baseline audio data to improve comparison. The electronic file created by the system is to include differences between audio of the subject segment and audio of the baseline segment.

In other examples of the disclosed system, a server or other computing device may receive an electronic file from an electromechanical device via a network. The received electronic file includes differences between subject audio data and baseline audio data. The subject audio data is indicative of a subject audio captured via a microphone during an operation of a subject electromechanical device. The baseline audio data is indicative of a baseline audio captured during an operation of a baseline electromechanical device. The computing device is to diagnose a current error or a predicted error in operation of the subject electromechanical device based upon the differences between subject audio data and baseline audio data.

In this manner, the disclosed examples provide for an efficient and easy to use method and system to compress audio data captured at a subject electromechanical device to create an electronic file, and to utilize the electronic file to diagnose current error and/or predict error in operation of the subject electromechanical device. As the electronic file is to include differences between the captured subject audio and the baseline audio, the size of the electronic file should be significantly less than that of a file holding raw audio data. Further, the compressed audio data included in the electronic file will be data that is highly relevant to identifying errors. Users will appreciate that the reduced costs and efficiencies of transmitting, analyzing, and storing such compressed audio data increase the feasibility of performing audio analysis to detect and predict device errors. For at least these reasons, manufacturers and users of electromechanical devices should each appreciate the significant enhancements in quality and throughput, and the reduction in operating and maintenance costs to be enjoyed with utilization of the disclosed examples.

FIG. 1 depicts an example environment 100 in which examples may be implemented as a system 102 for audio data compression. Environment 100 is shown to include computing device 104, server device 106, server devices 108, electromechanical device 110, and printer 112. Components 104-112 are interconnected via link 114.

Link 114 represents generally any infrastructure or combination of infrastructures to enable an electronic connection, wireless connection, other connection, or combination thereof, to enable data communication between components 104-112. Such infrastructure or infrastructures may include, but are not limited to, a cable, wireless, fiber optic, or remote connections via telecommunication link, an infrared link, or a radio frequency link. For example, link 114 may represent the internet, intranets, and any intermediate routers, switches, and other interfaces. As used herein, a "computing device" may be a server, computer networking device, chip set, desktop computer, notebook computer, workstation, tablet computer, smartphone, printer, or any other processing device or equipment. As used herein an "electronic connection" between components, e.g., between two computing devices, refers generally to a connection via an electrical conductor that may enable a transfer of data between components. A "wireless connection" between components, e.g., between two computing devices, refers generally to a connection between the components that is not via an electrical conductor and may enable a transfer of data between components. A wireless connection may be via a wireless communication protocol or wireless standard for exchanging data.

Server device 106 represents generally any computing device to serve an application and corresponding data for consumption by a computing device, e.g., computing device 104, server devices 108, electromechanical device 110, or printer 112. Server devices 108 represent generally any set of computing devices to serve an application and corresponding data for consumption by a computing device, e.g., computing device 104, server 106, electromechanical device 110, or printer 112.

Electromechanical device 110 represents generally any device which utilizes an electrical signal to create mechanical movement, and/or utilizes mechanical movement to create an electric signal. Printer 112 is a particular type of electromechanical device, representing generally an electronic device or group of electronic devices that consume a marking agent to produce a printed print job or printed content. Printer 110 includes hardware and programming for providing printing functions. Printer 110 may include an operating system to cause the printer to interpret print data, and a printing element to cause the application of one or more marking agents according to mapping provided by print data. In the case of 2D printing the one or more marking agents may be applied according to the print data mapping to a media and/or to another layer of marking agent previously applied to the media to form an image. In the case of 3D printing the one or more marking agents may be applied according to the print data mapping to a bed of marking agent or other build material, or to a previously applied layer of marking agent or other build material, to thereby form an object. In examples, printer 112 may be, but is not limited to, a liquid inkjet printer, a solid toner-based printer, a liquid toner-based printer, or a multifunctional device that performs a function such as scanning and/or copying in addition to printing. As used herein, a "print job" refers generally to content, e.g., an image, and/or instructions as to formatting and presentation of the content sent to a computer system for printing. In examples, a print job may be stored in a programming language and/or a numerical form so that the job can be stored and used in computing devices, servers, printers and other machines capable of performing calculations and manipulating data. As used herein, an "image" refers generally to a rendering of an object, scene, person, or abstraction such text or a geometric shape.

Computing device 104 represents generally any computing device with which a user may interact to communicate with server device 106, server devices 108, electromechanical device 110, and/or printer 112 via link 114. Computing device 104 is shown to include core device components 120. Core device components 120 represent generally the hardware and programming for providing the computing functions for which device 104 is designed. Such hardware may include a processor and memory, a display apparatus 122, and a user interface 124. The programming may include an operating system and applications. In examples, computing device 104 may include a display apparatus 122, representing generally any combination of hardware and programming to exhibit or present a message, image, view, or other presentation for perception by a user that can include, but is not limited to, a visual, tactile or auditory display. In examples, the display apparatus 122 may be or include a monitor, a touchscreen, a projection device, a touch/sensory display device, or a speaker. In examples, computing device 104 may include a user interface 124, representing generally any combination of hardware and programming to enable interaction between a user and device 104 such that the user may effect operation or control of device 104. In examples, user interface 124 may be, or include, a keyboard, keypad, or a mouse. In some examples, the functionality of display apparatus 122 and user interface 124 may be combined, as in the case of a touchscreen apparatus that may enable presentation of images at device 104, and that also may enable a user to operate or control functionality of device 104.

System 102, discussed in more detail below, represents generally a combination of hardware and programming to enable audio data compression. In some examples, system 102 may be wholly integrated within core device components 120. In other examples, system 102 may be implemented as a component of any of computing device 104, server device 106, server devices 108, electromechanical device 110, or printer 112 where it may take action based in part on data received from core device components 120 via link 114. In other examples, system 102 may be distributed across computing device 104, and any of server device 106, server devices 108, electromechanical device 110, and/or printer 112.

Figure 2A:
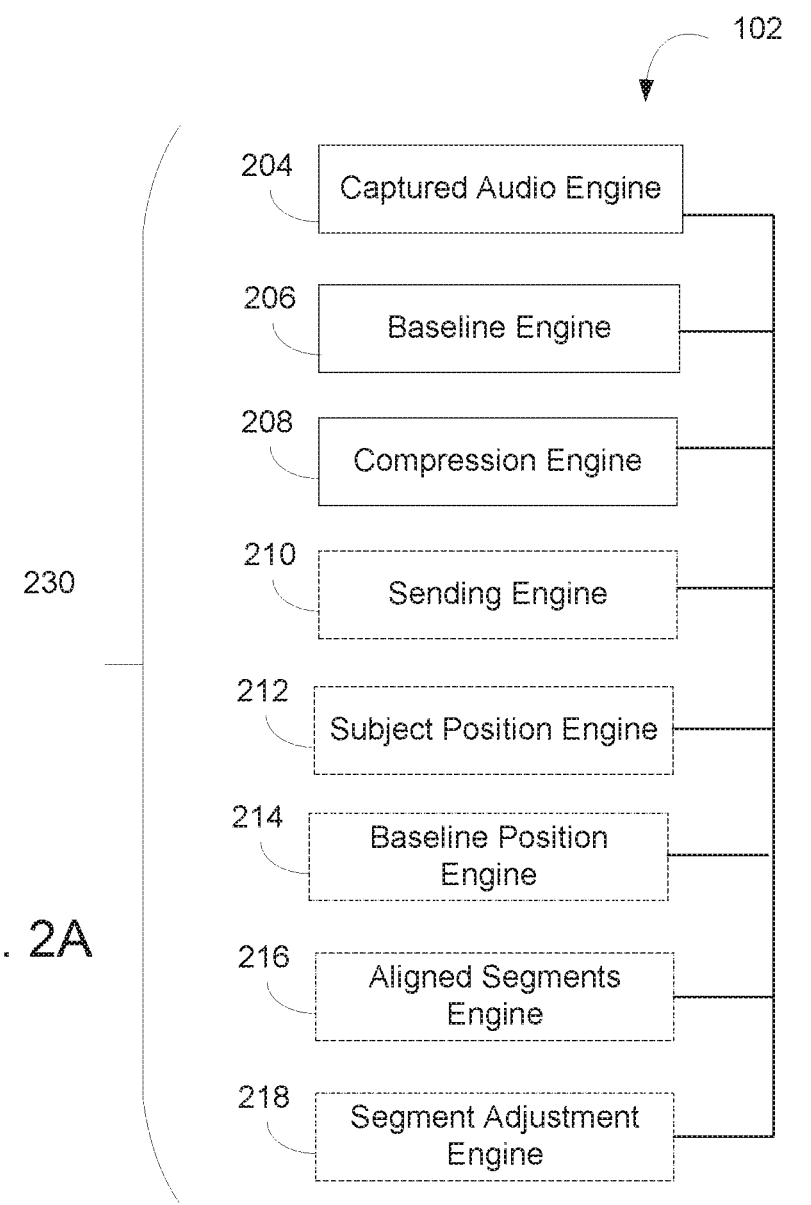
FIGS. 2A and 2B are block diagrams depicting examples of a system for audio data compression.
Figure 2B:
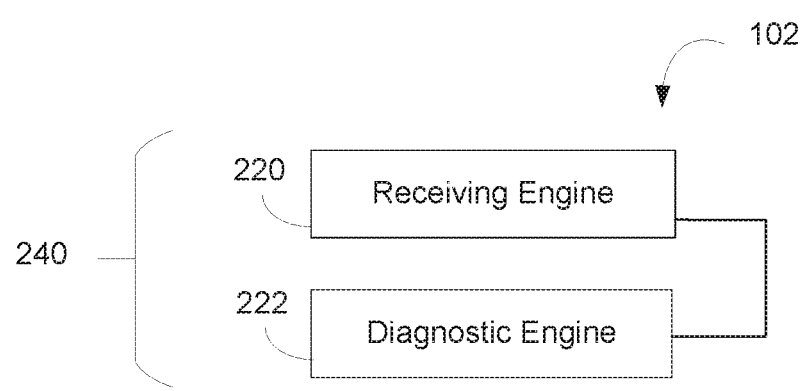

FIGS. 2A, 2B, 3A, and 3B depict examples of physical and logical components for implementing various examples. In FIGS. 2A and 2B various components are identified as engines 204, 206, 208, 210, 212, 214, 216, 218, 220, and 222. In describing engines 204-222 focus is on each engine's designated function. However, the term engine, as used herein, refers generally to a combination of hardware and programming to perform a designated function. As is illustrated later with respect to FIGS. 3A and 3B, the hardware of each engine, for example, may include one or both of a processor and a memory, while the programming may be code stored on that memory and executable by the processor to perform the designated function.

FIG. 2A is a block diagram depicting components of a system 102 to enable compression of audio data. In the example of FIG. 2A, system 102 may be included within an electromechanical device, e.g., electromechanical device 110 or printer 112. In this example, system 102 includes captured audio engine 204, baseline engine 206, compression engine 208, sending engine 210, subject position engine 212, baseline position engine 214, aligned segments engine 216, and segment adjustment engine 218. In performing their respective functions, engines 204-218 may access a data repository, e.g., any memory accessible to system 102 that can be used to store and retrieve data.

In an example, captured audio engine 204 represents generally a combination of hardware and programming to access subject audio data, the subject audio being indicative of a subject audio captured via a transducer during an operation of a subject electromechanical device. As used herein "data" refers generally to representations in the form of digital electrical signals (including, but not limited to representations of quantities, characters, and symbols) upon which operations may performed by a computer (e.g., including, but not limited to read, write, and transmit operations). As used herein "audio data" refers generally to data that is indicative of audio detected by a microphone or other transducer. As used herein "transducer" refers generally to a device that converts variations in a physical quantity, such as sound or acoustic pressure, into an electrical signal, or vice versa. As used herein a "microphone" refers generally to a transducer that converts sound into an electrical signal or electrical variations, wherein the signal or variations may then be recorded or otherwise captured, amplified, or transmitted.

Baseline engine 206 represents generally a combination of hardware and programming to access baseline audio data indicative of a baseline audio captured during an operation of a baseline electromechanical device. In certain examples of the disclosure, the subject electromechanical device and the subject electromechanical device will be devices having a same model identifier. As used herein, and "identifier" refers generally to something (e.g., any text, number, PIN, password, character string, image, graphic, or other data or element) that can be processed and stored by a computer, and that identifies, indicates, or names a model or type of electromechanical device. For instance, if a particular subject electromechanical device is a HP Inc. printer, an identifier for such subject printer may be "HP Officejet Pro 8710 All-in-One." In examples, the baseline electromechanical device for capturing baseline audio may be printer of the same "HP Officejet Pro 8710 All-in-One" model identifier.

Compression engine 208 represents generally a combination of hardware and programming to create an electronic file that includes differences between the captured subject audio data and the baseline audio data. As used herein, "electronic file" refers generally to an object or other resource that serves as an electronic record (e.g. a record of information or instructions or use) that can be accessed or opened utilizing an application or other computer program. In examples, the electronic file may be an executable computer file or a non-executable computer file. In certain examples, compression engine 208 may subtract the subject captured audio from the baseline audio to create the electronic file. In other examples, compression engine 208 may subtract the baseline audio from the subject captured audio to create the electronic file.

In other examples, compression engine 208 may create the electronic file by recording differences in applied transformations in audio frequency as between the subject audio data and the baseline audio data. In these examples, compression engine 208 can reduce or eliminate noise (for instance, but not limited to, sounds at frequencies that are inaudible to humans) by comparing transforms of the subject audio data and the baseline audio data rather than raw subject audio data and raw baseline audio data. "Transformations" and "transforms" are used synonymously herein. In one example, compression engine 208 may utilize a Discrete Cosine Transform (DCT) to create transforms of the subject audio data and the baseline audio data, and then record audio frequency differences in transforms. In another example, compression engine 208 may obtain (e.g., from memory or from another computing device) DCT transforms of the subject audio data and the baseline audio data rather than generate the transforms, and then record the differences in frequency of the transforms. In certain examples, the DCT transform utilized may be a type-II DCT. In other examples, the transforms of the subject audio data and the baseline audio data may be transforms generated utilizing a discrete sine transform (DST) or modified discrete cosine transform (MDCT), or another type of Fourier transform.

In certain examples of the disclosure, system 102 may include a sending engine 210. Sending engine 210 represents generally a combination of hardware and programming to send the created electronic file to a diagnostic computer system. As used herein a "diagnostic computer system" refers to any computing system hosting hosts an application or service that is to diagnose current or predicted errors in operation of electromechanical device. Such diagnosis may in turn be sent by the diagnostic computer system to a technician or other user, or to another computing device, that utilizes the diagnosis to fix, repair, or perform a maintenance action with respect to the electromechanical device.

In certain examples of the disclosure, system 102 may include subject position engine 212, baseline position engine 214, aligned segments engine 216, and segment adjustment engine 214. Subject position engine 212 represents generally a combination of hardware and programming to access data indicative of readings from a positional sensor at the subject electromechanical device. Subject position engine 212 in turn utilizes the accessed positional sensor data to determine a subject position along a process route as the subject audio is captured. In examples, subject position engine 212 may determine the position along a process route in response to a trigger condition detected via the positional sensor.

In a particular example where the electromechanical device is a subject printer, the subject position along a process route can be a subject media position along a media path in the subject printer. As used herein, "media" and "print media" are used synonymously and may include a pre-cut media, a continuous roll or web media, or any other article or object on which a printed image can be formed. In particular examples, the media is a pre-cut or sheet of media, and position along the media path within the subject printer at the time the subject audio is captured may be determined by a positional sensor (e.g., a contact sensor) and can be a trigger condition as the media bumps into the sensor in the paper path. In other examples, a trigger condition of a position of media within the paper path of a printer when the subject audio is captured might be determined utilizing a positional sensor other than a contact sensor, e.g., an optical sensor that can identify the presence and position of a media according to its reflectance values.

Baseline position engine 214 represents generally a combination of hardware and programming to access data representative of a baseline position along a process route as the baseline audio was recorded at the baseline electromechanical device. In examples, baseline position engine 214 may determine the position along a process route within the baseline electromechanical device in response to a trigger condition detected via a positional sensor within the baseline electromechanical device. Returning to the example of the preceding paragraph in which the electromechanical device is a baseline printer, the baseline position along a process route can be a baseline media position along a media path in the baseline printer. If the media is a pre-cut or sheet of media, the trigger condition may be a media position along the media path within the baseline printer at the time the baseline audio is captured. In examples, the media position may be determined by a contact sensor as the media bumps into the sensor in the paper path. In other examples, a trigger condition of position of media within the paper path of a printer when the baseline audio is captured might be determined utilizing an optical sensor or other sensor.

Aligned segments engine 216 represents generally a combination of hardware and programming to, utilizing the subject position determined by the subject position engine 212 and the baseline position determined by the baseline position engine 214, identify a subject segment of the captured audio and a baseline segment of the baseline audio that are representative of a same operation performed at the subject and baseline electromechanical devices. In this manner, the identified subject segment of the captured audio and the identified baseline segment will be representative of a same point, stage, or function in the operation of the electromechanical device.

It should be noted that while the discussion of system 102 frequently refers to a transducer for capturing audio at the subject electromechanical device, in some examples, the multiple transducers may be included within the subject electromechanical device. For instance, in a particular example captured audio engine 204 may utilize a first transducer located at a first position along the process route of the subject electromechanical device and a second transducer at a second position along the process route to capture the subject audio. In certain examples, the first and second transducers could function as positional sensors (e.g., tracking location of media in a media process path) as well as functioning as audio-capturing transducers.

In some scenarios, the identified subject segment of captured audio and the identified baseline segment of audio may be aligned in terms of having been recorded at a same process point in the operation of the subject electromechanical device and the baseline electromechanical device, yet have different durations. This durations difference may occur as one of the subject electromechanical device and the baseline electromechanical device may be faster than the other, due to an inherent or benign difference in the devices, or due to an error at one of the devices that causes the device to operate in a manner slower than expected. System 102 may include a segment adjustment engine 218 to address these scenarios. Segment adjustment engine 218 represents generally a combination of hardware and programming to adjust a speed or duration of at least one of the subject segment and the baseline segment such that the identified captured audio segment and the identified baseline audio segment after adjustment have a same duration. In one example, segment adjustment engine 218 may adjust a speed or duration of at one of the subject segment or the baseline segment to match the other's duration utilizing a stretching duration adjustment. In another example, segment adjustment engine 218 may adjust speed or duration of one or the other of the subject segment and the baseline segment to match the duration of the other utilizing a reducing duration adjustment. Segment adjustment engine 218 may utilize any of a number of available time-stretching processes or programs to accomplish the stretching or reducing adjustment.

In examples, captured audio engine 204 may access the subject audio, baseline engine 206 may access the baseline audio, subject position engine 212 may access positional sensor data, baseline position engine 214 may access baseline position data, and/or sending engine 208 may send the electronic file to a diagnostic computer system over a link 114 utilizing a networking protocol. In examples the networking protocols utilized may include, but are not limited to, Transmission Control Protocol/Internet Protocol ("TCP/IP"), HyperText Transfer Protocol ("HTTP"), and and/or Session Initiation Protocol ("SIP").

FIG. 2B is a block diagram depicting components of a system 102 to perform diagnostics for a electromechanical device based upon compressed audio data. In the example of FIG. 2B, system 102 may be hosted by a server device or service devices, e.g., server device 106 or server devices 108 of FIG. 1, or by computing device 104. In this example, system 102 includes a receiving engine 220 and a diagnostic engine 222. In performing their respective functions, engines 220 and 222 may access a data repository, e.g., any memory accessible to system 102 that can be used to store and retrieve data.

In an example, receiving engine 220 represents generally a combination of hardware and programming to receive an electronic file from a subject electromechanical device via a network, e.g., from electromechanical device 110, printer 112, or an intermediary computing device not shown on FIG. 1 via link 114.

The received electronic file includes differences between subject audio data and baseline audio data. As described in previous paragraphs, the subject audio data is indicative of a subject audio captured via a microphone or other transducer during an operation of the subject electromechanical device, and the baseline audio data is indicative of a baseline audio during an operation of a baseline electromechanical device. In examples, the baseline audio may be audio captured via a microphone or other transducer at the baseline electromechanical device. In examples, receiving engine 220 may receive the electronic file via a networking protocol.

Diagnostic engine 222 represents generally a combination of hardware and programming to diagnose a current error or a predicted error in operation of the subject electromechanical device based upon the differences between subject audio data and baseline audio data included in the electronic file. In examples, diagnostic module 222 may access a lookup file that includes data indicative of significance of a differences between subject audio data and baseline audio data, and diagnose a current error or a predicted error in the operation of the printer based upon the accessed significance data. As discussed previously, in some examples the electronic file may be a record of differences in the transforms in audio frequency as between the subject audio data and the baseline audio data, rather than a record of differences in raw subject audio data and raw baseline audio data. In certain examples, diagnostic engine 222 can diagnose a current error or a predicted error in operation of the subject electromechanical device based upon a subtraction of one of an audio data frequency transform and a baseline audio data frequency transform from the other, wherein a result of the subtraction is indicated in the electronic file.

In examples, receiving 220 may receive the electronic file from the subject electromechanical device, and/or diagnostic module 222 may access a lookup file including significance data over a link 114 utilizing a networking protocol. In examples the networking protocols utilized may include, but are not limited to, Transmission Control Protocol/Internet Protocol ("TCP/IP"), HyperText Transfer Protocol ("HTTP"), and and/or Session Initiation Protocol ("SIP").

With reference back to FIG. 1 in view of FIGS. 2A and 2B, in one example system 102 may include a compression component 230 that includes engines 204-218 operating on an electromechanical device such as electromechanical device 110 or printer 112. In another example, system 102 may include a diagnostic component 240 that includes engines 220-222 operating on server device 106, server devices 108, computing device 104, or another computing device shown or not shown in FIG. 1. In other examples, system 102 may have any of engines 204-218 and engines 220-222 included within, or distributed across, any one or several of computing device 104, server device 106, server devices 108, electromechanical device 110, and printer 112.

In the foregoing discussion of FIGS. 2A and 2B, engines 204-222 were described as combinations of hardware and programming. Engines 204-222 may be implemented in a number of fashions. Looking at FIGS. 3A and 3B, the programming may be processor executable instructions stored on a tangible memory resource 330 and the hardware may include a processing resource 340 for executing those instructions. Thus memory resource 330 can be said to store program instructions that when executed by processing resource 340 implement system 102 of FIGS. 2A and 2B.

Memory resource 330 represents generally any number of memory components capable of storing instructions that can be executed by processing resource 340. Memory resource 330 is non-transitory in the sense that it does not encompass a transitory signal but instead is made up of more or more memory components to store the relevant instructions. Memory resource 330 may be implemented in a single device or distributed across devices. Likewise, processing resource 340 represents any number of processors capable of executing instructions stored by memory resource 330. Processing resource 340 may be integrated in a single device or distributed across devices. Further, memory resource 330 may be fully or partially integrated in the same device as processing resource 340, or it may be separate but accessible to that device and processing resource 340.

In one example, the program instructions can be part of an installation package that when installed can be executed by processing resource 340 to implement system 102. In this case, memory resource 330 may be a portable medium such as a CD, DVD, or flash drive or a memory maintained by a server from which the installation package can be downloaded and installed. In another example, the program instructions may be part of an application or applications already installed. Here, memory resource 330 can include integrated memory such as a hard drive, solid state drive, or the like.

Figure 3A:
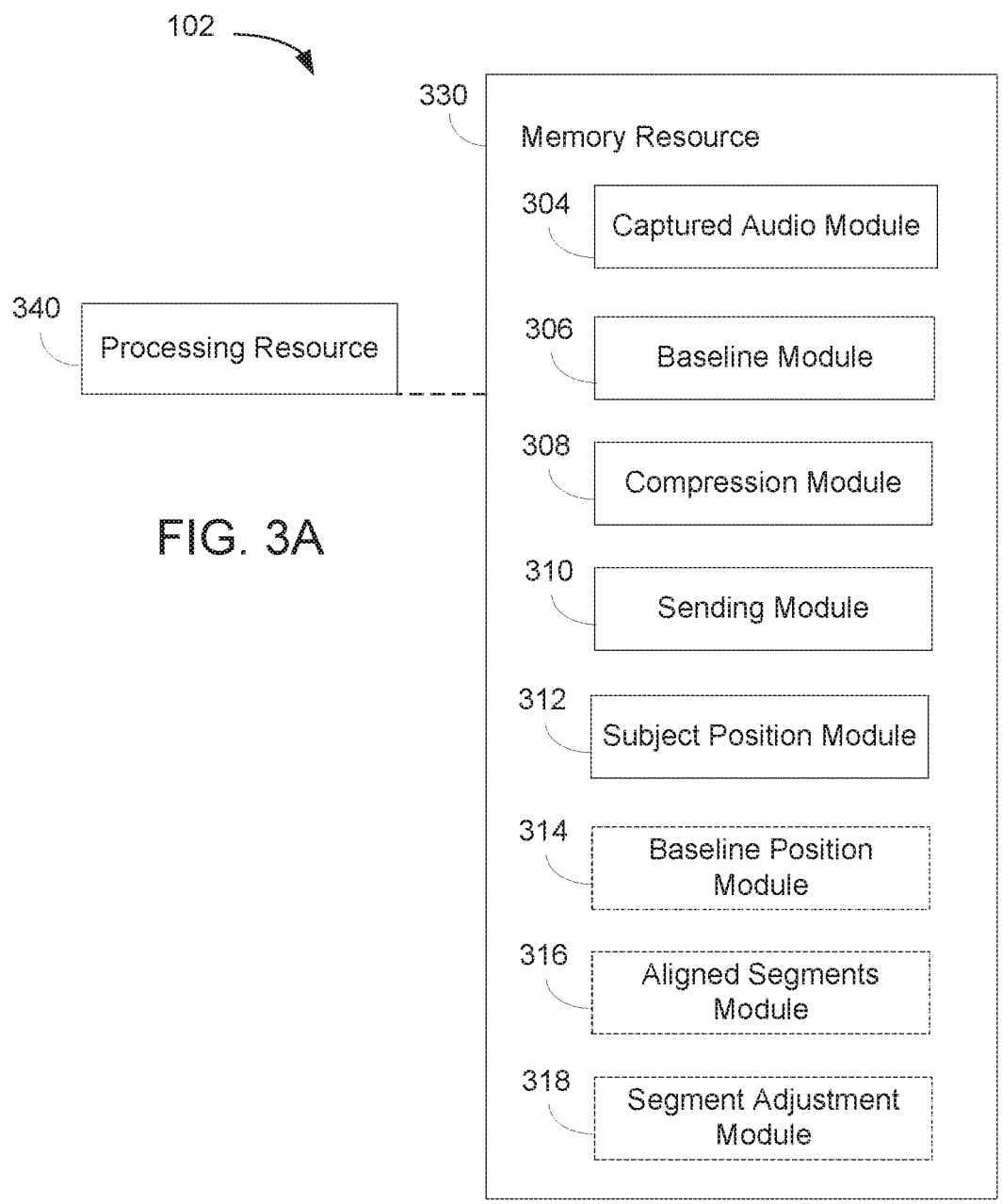
FIGS. 3A and 3B are block diagrams depicting a memory resource and a processing resource to implement examples of a system for audio data compression.

In FIG. 3A, the executable program instructions stored in memory resource 330 are depicted as captured audio module 304, baseline module 306, compression module 308, sending module 310, subject position module 312, baseline position module 314, aligned segments module 316, and segment adjustment module 318. Captured audio module 304 represents program instructions that when executed by processing resource 340 may perform any of the functionalities described above in relation to captured audio engine 204 of FIG. 2A. Baseline module 306 represents program instructions that when executed by processing resource 340 may perform any of the functionalities described above in relation to baseline engine 206 of FIG. 2A. Compression module 308 represents program instructions that when executed by processing resource 340 may perform any of the functionalities described above in relation to compression engine 208 of FIG. 2A. Sending module 310 represents program instructions that when executed by processing resource 340 may perform any of the functionalities described above in relation to sending engine 210 of FIG. 2A. Subject position module 312 represents program instructions that when executed by processing resource 340 may perform any of the functionalities described above in relation to subject position engine 212 of FIG. 2A. Baseline position module 314 represents program instructions that when executed by processing resource 340 may perform any of the functionalities described above in relation to baseline position engine 214 of FIG. 2A. Aligned segments module 316 represents program instructions that when executed by processing resource 340 may perform any of the functionalities described above in relation to aligned segments engine 216 of FIG. 2A. Segment adjustment module 318 represents program instructions that when executed by processing resource 340 may perform any of the functionalities described above in relation to segment adjustment engine 218 of FIG. 2A.

Figure 3B:
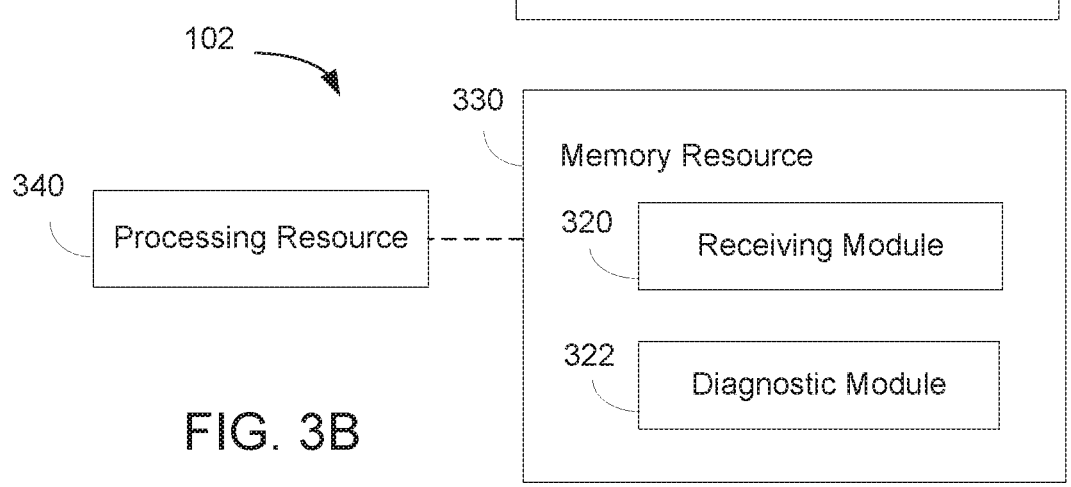

In FIG. 3B, the executable program instructions stored in memory resource 330 are depicted as receiving module 320 and diagnostic module 322. Receiving module 320 represents program instructions that when executed by processing resource 340 may perform any of the functionalities described above in relation to receiving engine 220 of FIG. 2B. Diagnostic module 322 represents program instructions that when executed by processing resource 340 may perform any of the functionalities described above in relation to diagnostic engine 222 of FIG. 2B.

Figure 4:
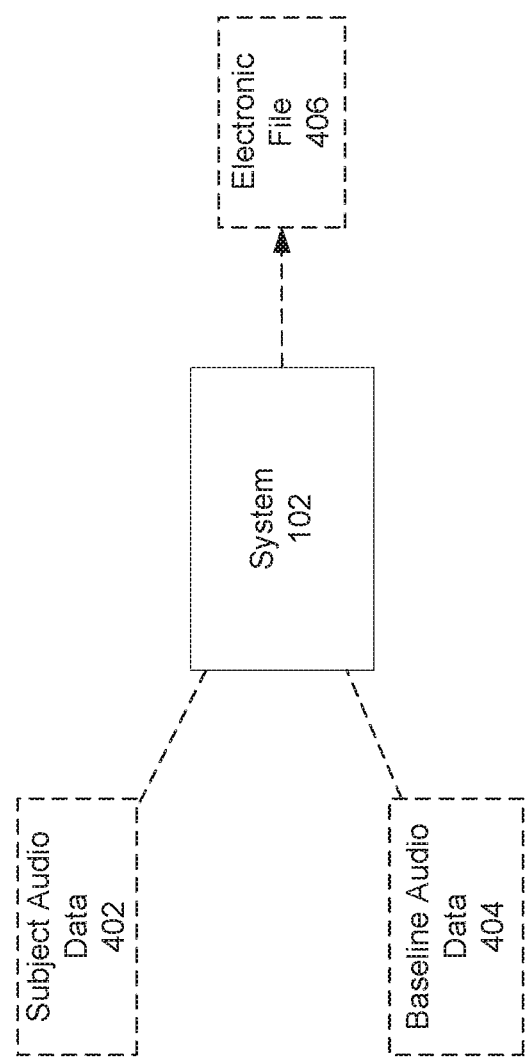
FIG. 4 illustrates an example of a system for audio data compression.

FIG. 4, in view of FIGS. 1, 2A, and 2B, illustrates an example of implementation of system 102 for audio data compression and diagnostics based upon the results of such compression. In the particular example of FIG. 4, system 102 may be hosted at an electromechanical device, e.g., electromechanical device 110 or printer 112 of FIG. 1. In this example, system 102 accesses subject audio data 402 indicative of a subject audio captured via a microphone, or set of microphones, during an operation of the subject electromechanical device. System 102 also accesses baseline audio data 404 indicative of a baseline audio captured during an operation of a baseline electromechanical device. System 102 in turn creates an electronic file 406 that includes differences between the subject audio data and the baseline audio data. In examples, system 102 may send electronic file 406 to a diagnostic computer system, for the diagnostic computer system to utilize in diagnosing a current or predicted error in operation of the subject electromechanical device.

Figure 5:
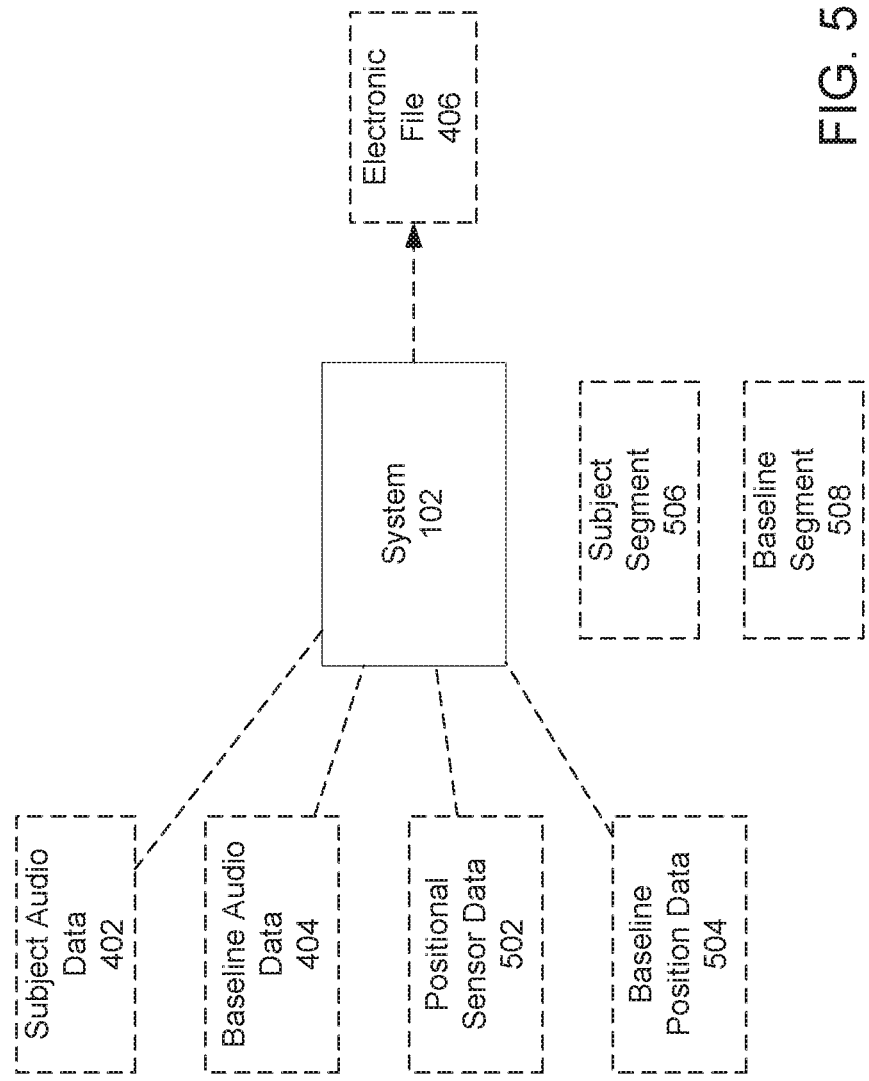
FIG. 5 illustrates an example of a system for audio data compression, the example including use of positional sensor data and baseline position data to identify audio segments representative of a same operation performed at the subject and baseline electromechanical devices.

FIG. 5, in view of FIGS. 1, 2A, and 2B illustrates another example of implementation of system 102 for audio data compression and diagnostics based upon the results of such compression. In the particular example of FIG. 5, system 102 may be hosted at a printer electromechanical device, such as printer 112 of FIG. 1 (hereinafter in this FIG. 5 example described as "subject printer"). In this example, system 102 accesses subject audio data 402 indicative of a subject audio captured via a microphone, or set of microphones, during an operation of the subject printer. System 102 accesses baseline audio data 404 indicative of a baseline audio captured during an operation of a baseline printer, which in examples may be a baseline printer of a same model or type as the subject printer.

System 102 utilizes positional sensor data 502 to determine a subject media position along a media path of the subject printer as the subject audio is captured. System 102 accesses baseline position data 504 that is representative of a baseline position along a similar media path at the baseline printer as the baseline audio was recorded. System 102 utilizes the determined subject position and the baseline position to identify a subject segment 506 of the captured audio and a baseline segment 508 of the baseline audio that are representative of a same operation performed at the subject printer and the baseline printer.

Continuing with the example of FIG. 5, system 102 creates and sends to a server device (e.g., server 106 or server devices 108) hosting a diagnostic service an electronic file 406. In this example, electronic file 406 includes the result of subtracting one of the recorded captured audio and the baseline captured audio from the other. In other examples, electronic file 406 may be or include a recording of differences in transforms of audio frequency as between the subject audio data and the baseline audio data.

The diagnostic server device may utilize the received electronic file 406 to diagnose a current error or a predicted error in operation of the subject printer based upon the differences between subject audio data and baseline audio data. In some examples the diagnosis or prediction may be based upon a comparison of transforms of the subject audio data and the baseline audio data, e.g. transforms according to a DCT process. In certain examples, the diagnostic server device may send a message indicative of the diagnosis or prediction to system 102 and/or to the subject printer. In other examples, the diagnostic server device may send a message or notice that includes the diagnosis or prediction to a computing device associated with a technician or system administrator for the printer. In yet other examples, the diagnostic server device may store the diagnosis or prediction, enabling electronic access or retrieval by a computer system associated with an authorized user (e.g., an authorized technician or administrator), or access or retrieval by an authorized user that directly accesses the diagnostic server system via a user interface.

Figure 6:
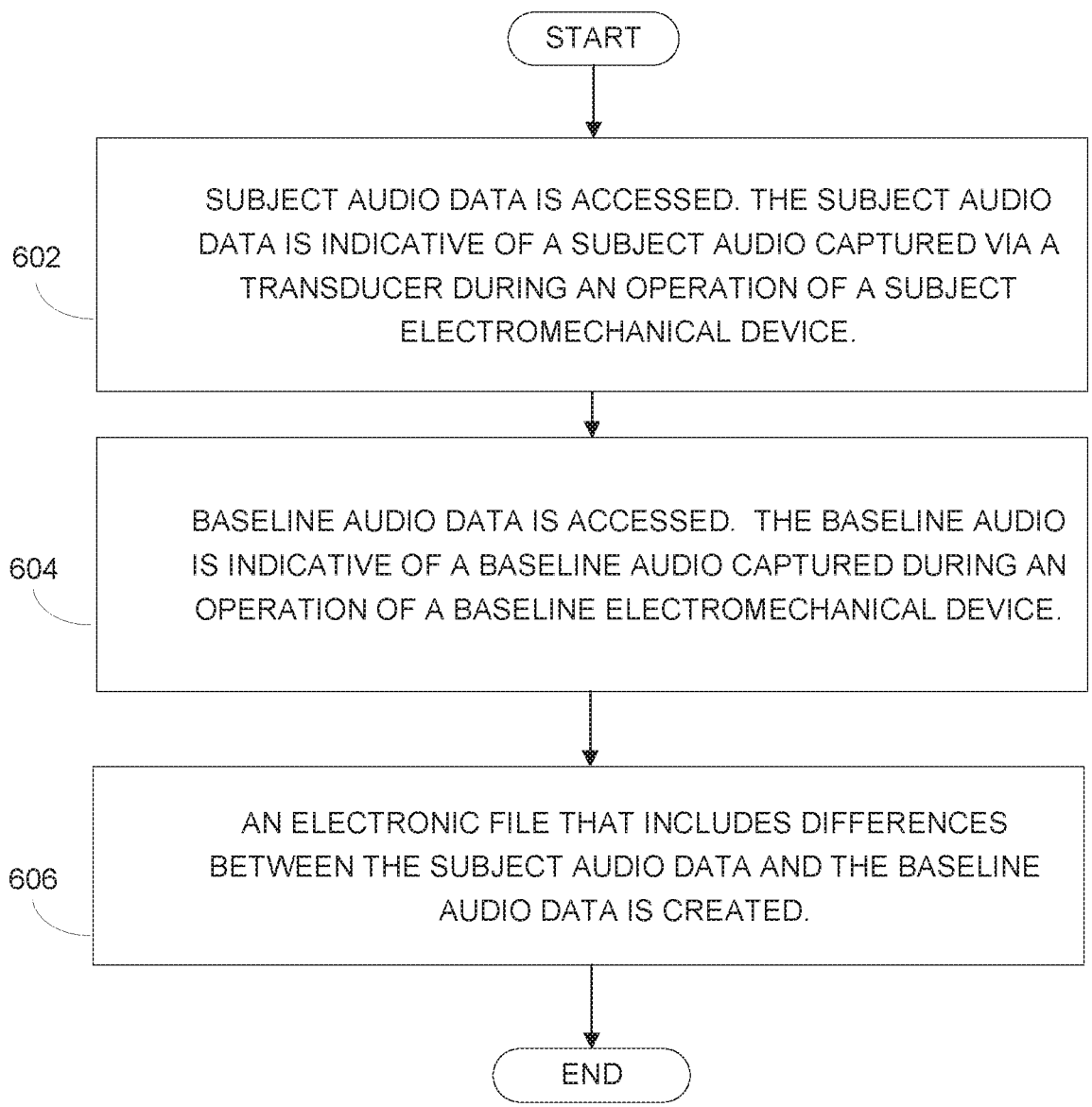
FIG. 6 is a flow diagram depicting implementation of an example of a method for audio data compression.

FIG. 6 is a flow diagram of implementation of a method for audio data compression. In discussing FIG. 6, reference may be made to the components depicted in FIGS. 2A and 3A. Such reference is made to provide contextual examples and not to limit the manner in which the method depicted by FIG. 6 may be implemented. Subject audio data is accessed. The subject audio data is indicative of a subject audio captured via a transducer during an operation of a subject electromechanical device (block 602). Referring back to FIGS. 2A and 3A, captured audio engine 204 (FIG. 2A) or captured audio module 304 (FIG. 3A), when executed by processing resource 340, may be responsible for implementing block 602.

Baseline audio data is accessed. The baseline audio is indicative of a baseline audio captured during an operation of a baseline electromechanical device (block 604). Referring back to FIGS. 2A and 3A, baseline engine 206 (FIG. 2A) or baseline module 306 (FIG. 3A), when executed by processing resource 340, may be responsible for implementing block 604.

An electronic file that includes differences between the subject audio data and the baseline audio data is created (block 606). Referring back to FIGS. 2A and 3A, compression engine 208 (FIG. 2A) or compression module 308 (FIG. 3A), when executed by processing resource 340, may be responsible for implementing block 606.

Figure 7:
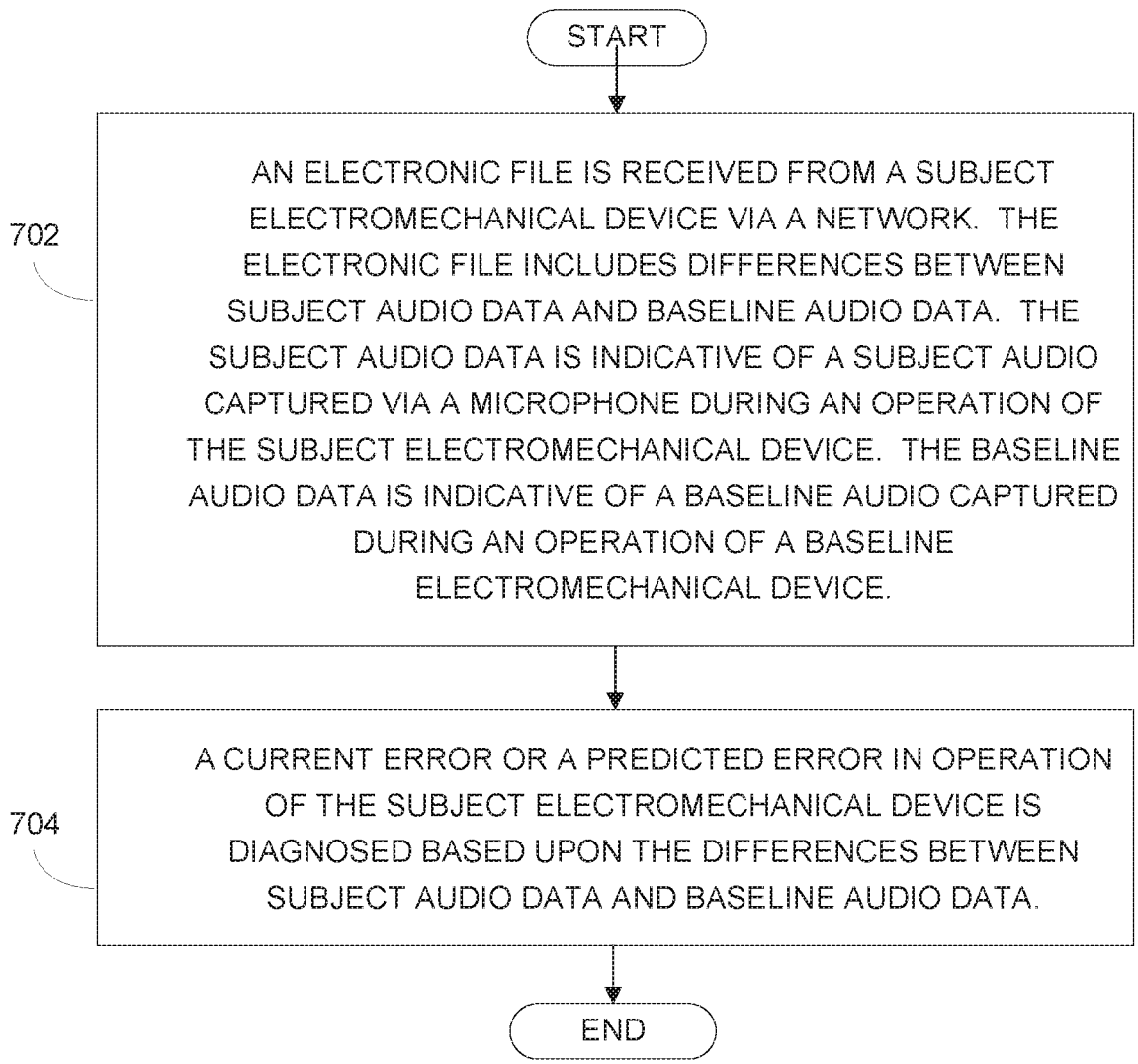
FIG. 7 is a flow diagram depicting implementation of an example of a method to method to diagnose an error in operation of a printer utilizing the disclosed compressed audio data.

FIG. 7 is a flow diagram of implementation of a method to diagnose an error in operation of an electromechanical device utilizing the disclosed audio data compression. In discussing FIG. 7, reference may be made to the components depicted in FIGS. 2B and 3B. Such reference is made to provide contextual examples and not to limit the manner in which the method depicted by FIG. 7 may be implemented. An electronic file is received from a subject electromechanical device via a network. The electronic file includes differences between subject audio data and baseline audio data. The subject audio data is indicative of a subject audio captured via a microphone during an operation of the subject electromechanical device. The baseline audio data is indicative of a baseline audio captured during an operation of a baseline electromechanical device (block 702). Referring back to FIGS. 2B and 3B, receiving engine 220 (FIG. 2B) or receiving module 320 (FIG. 3B), when executed by processing resource 340, may be responsible for implementing block 702.

A current error or a predicted error in operation of the subject electromechanical device is diagnosed based upon the differences between subject audio data and baseline audio data (block 704). Referring back to FIGS. 2B and 3B, diagnostic engine 222 (FIG. 2B) or diagnostic module 322 (FIG. 3B), when executed by processing resource 340, may be responsible for implementing block 704.

FIGS. 1-7 aid in depicting the architecture, functionality, and operation of various examples. In particular, FIGS. 1, 2A, 2B, 3A, and 3B depict various physical and logical components. Various components are defined at least in part as programs or programming. Each such component, portion thereof, or various combinations thereof may represent in whole or in part a module, segment, or portion of code that comprises executable instructions to implement any specified logical function(s). Each component or various combinations thereof may represent a circuit or a number of interconnected circuits to implement the specified logical function(s). Examples can be realized in any memory resource for use by or in connection with processing resource. A "processing resource" is an instruction execution system such as a computer/processor based system or an ASIC (Application Specific Integrated Circuit) or other system that can fetch or obtain instructions and data from computer-readable media and execute the instructions contained therein. A "memory resource" is any non-transitory storage media that can contain, store, or maintain programs and data for use by or in connection with the instruction execution system. The term "non-transitory" is used only to clarify that the term media, as used herein, does not encompass a signal. Thus, the memory resource can comprise any one of many physical media such as, for example, electronic, magnetic, optical, electromagnetic, or semiconductor media. More specific examples of suitable computer-readable media include, but are not limited to, hard drives, solid state drives, random access memory (RAM), read-only memory (ROM), erasable programmable read-only memory, flash drives, and portable compact discs.

Although the flow diagrams of FIGS. 6 and 7 show specific orders of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein. All of the features disclosed in this specification (including any accompanying claims, abstract and drawings), and/or all of the blocks or stages of any method or process so disclosed, may be combined in any combination, except combinations where at least some of such features, blocks and/or stages are mutually exclusive.

What is claimed is:

1. An audio data compression system, comprising:
a captured audio engine, to access subject audio data indicative of a subject audio captured via a transducer during an operation of a subject electromechanical device;
a baseline engine, to access baseline audio data indicative of a baseline audio captured during an operation of a baseline electromechanical device;
a compression engine, to create an electronic file that includes differences between the subject audio data and the baseline audio data;
a subject position engine, to access data indicative of readings from a positional sensor at the subject electromechanical device, and utilize the positional sensor data to determine a subject position along a process route as the subject audio is captured;
a baseline position engine, to access data representative of a baseline position along a process route as the baseline audio was recorded;
an aligned segments engine, to utilize the determined subject position and the baseline position to identify a subject segment of the captured audio and a baseline segment of the baseline audio that are representative of a same operation performed at the subject and baseline electromechanical devices; and
a segment adjustment engine to adjust a duration of at least one of the subject segment and the baseline segment such that the identified captured audio segment and the identified baseline audio segment after adjustment have a same duration,
wherein the electronic file created by the compression engine is to include differences between the subject segment and the baseline segment.

2. The system of claim 1, wherein the compression engine is to subtract one of the subject captured audio and the baseline captured audio from the other to create the electronic file.

3. The system of claim 1, wherein the subject electromechanical device and the baseline electromechanical device have a same model identifier.

4. The system of claim 1, wherein the audio data compression system is included within the subject electromechanical device.

5. The system of claim 1, wherein the compression engine is to create the electronic file by recording differences in transforms of audio frequency as between the subject audio data and the baseline audio data.

6. The system of claim 1, wherein the subject position engine is to determine the position along a process route in response to a trigger condition detected via the positional sensor.

7. The system of claim 1, wherein the adjusting of a duration of at least one of the subject segment and the baseline segment is a stretching duration adjustment or a reducing duration adjustment.

8. The system of claim 1, wherein the electromechanical device is a printer, and wherein the subject position along a process route is a subject media position along a media path, and wherein the baseline position along a process route is a baseline media position along a media path.

9. The system of claim 1, further comprising a sending engine, to send the electronic file to a diagnostic computer system, for the diagnostic computer system to utilize in diagnosing a current or predicted error in operation of the subject electromechanical device.

10. The system of claim 1, wherein the transducer is a first transducer at a first position along the process route at the subject electromechanical device, and wherein the captured audio engine is to utilize the first transducer and a second transducer at a second position along the process route to capture the subject audio.

11. A method to diagnose an error in operation of a printer utilizing compressed audio data, comprising:
accessing subject audio data indicative of a subject audio captured via a microphone during an operation of a subject printer and baseline audio data indicative of a baseline audio captured during an operation of a baseline printer;
utilizing positional sensor data to determine a subject media position along a media path as the subject audio is captured;
accessing data representative of a baseline position along a media path as the baseline audio was recorded;
utilizing the determined subject position and the baseline position to identify a subject segment of the captured audio and a baseline segment of the baseline audio that are representative of a same operation performed at the subject printer and the baseline printer;
adjusting a duration of at least one of the subject segment and the baseline segment such that the identified captured audio segment and the identified baseline audio segment after adjustment have a same duration; and
creating and sending to a server device hosting a diagnostic service an electronic file that includes the result of subtracting one of a transform of recorded captured audio and a transform of the baseline captured audio from the other.

12. A memory resource storing instructions that when executed are to cause a processing resource to perform diagnostics based upon compressed audio data, comprising:
a captured audio module, to access subject audio data indicative of a subject audio captured via a transducer during an operation of a subject electromechanical device;
a baseline module, to access baseline audio data indicative of a baseline audio captured during an operation of a baseline electromechanical device;
a compression module, to create an electronic file that includes differences between the subject audio data and the baseline audio data;
a subject position module, to access data indicative of readings from a positional sensor at the subject electromechanical device, and utilize the positional sensor data to determine a subject position along a process route as the subject audio is captured;
a baseline position module, to access data representative of a baseline position along a process route as the baseline audio was recorded;
an aligned segments module, to utilize the determined subject position and the baseline position to identify a subject segment of the captured audio and a baseline segment of the baseline audio that are representative of a same operation performed at the subject and baseline electromechanical devices; and
a segment adjustment module to adjust a duration of at least one of the subject segment and the baseline segment such that the identified captured audio segment and the identified baseline audio segment after adjustment have a same duration,
wherein the electronic file created by the compression module is to include differences between the subject segment and the baseline segment.

13. The method of claim 11, wherein the adjusting of a duration of at least one of the subject segment and the baseline segment is a stretching duration adjustment or a reducing duration adjustment.

14. The memory resource of claim 12, wherein the adjusting of a duration of at least one of the subject segment and the baseline segment is a stretching duration adjustment or a reducing duration adjustment.

\* \* \* \* \*